US012670951B2

(12) United States Patent
Watanabe

(10) Patent No.: US 12,670,951 B2
(45) Date of Patent: Jun. 30, 2026

(54) SILICON BRAIN

(71) Applicant: Hiroshi Watanabe, Yokohama (JP)

(72) Inventor: Hiroshi Watanabe, Yokohama (JP)

( * ) Notice: Subject to any disclaimer, the term of this patent is extended or adjusted under 35 U.S.C. 154(b) by 121 days.

(21) Appl. No.: 18/858,624

(22) PCT Filed: May 19, 2023

(86) PCT No.: PCT/JP2023/018673
§ 371 (c)(1),
(2) Date: Oct. 21, 2024

(87) PCT Pub. No.: WO2023/228869
PCT Pub. Date: Nov. 30, 2023

(65) Prior Publication Data
US 2025/0285696 A1     Sep. 11, 2025

(30) Foreign Application Priority Data

May 21, 2022    (JP) ................................. 2022-083458

(51) Int. Cl.
G11C 11/54        (2006.01)
G06N 3/063        (2023.01)
(Continued)

(52) U.S. Cl.
CPC .............. G11C 11/54 (2013.01); G06N 3/063 (2013.01); G11C 13/0002 (2013.01);
(Continued)

(58) Field of Classification Search
CPC ..... G11C 11/54; G11C 13/0002; G11C 16/04; G11C 27/005; G11C 13/00; G06N 3/063; G06G 7/60
See application file for complete search history.

(56) References Cited

U.S. PATENT DOCUMENTS

2009/0083202 A1* 3/2009 Tanaka ................... G06N 3/063
706/15
2015/0286924 A1* 10/2015 Arthur ................... G06N 3/049
706/25
(Continued)

FOREIGN PATENT DOCUMENTS

JP          2009-80892 A      4/2009
JP          2018-521400 A     8/2018
WO     WO2017/010049 A1      1/2017

OTHER PUBLICATIONS

Goodon E. Moore, "Cramming more components onto integrated circuits", Electronics, vol. 38, No. 8, Apr. 19, 1965.
(Continued)

*Primary Examiner* — Jay W. Radke
(74) *Attorney, Agent, or Firm* — MUNCY, GEISSLER, OLDS & LOWE, P.C.

(57)        ABSTRACT

The unit to count the storage capacity of the current computing is bit. Hence, the number of transistors (cells) which serve as nodes, that is, the bit number is the unit of the current information communication. On the contrary, the human brain is composed of the cranial nerve circuit. Hence, the memory capacity of the human being is not based on the number of cranial nerves (node number). The complication of the circuit is greater than the bit capacity even with the same node number. The modern artificial intelligence, which tries to reproduce the human brain using the computing based on the bit unit, processes information in an inherently different manner from the human brain. Hence, it is inherently wasteful. Furthermore, the computing based on the bit number is always facing the limitation of integration.

9 Claims, 7 Drawing Sheets

(51) Int. Cl.

| | | |
|---|---|---|
| *G11C 13/00* | (2006.01) | |
| *G11C 16/04* | (2006.01) | |
| *G06G 7/60* | (2006.01) | |
| *G11C 27/00* | (2006.01) | |

(52) U.S. Cl.
CPC .............. *G11C 16/04* (2013.01); *G06G 7/60* (2013.01); *G11C 27/005* (2013.01)

(56) References Cited

U.S. PATENT DOCUMENTS

| | | | |
|---|---|---|---|
| 2017/0017879 | A1 | 1/2017 | Kataeva et al. |
| 2019/0019538 | A1* | 1/2019 | Li ............................. G11C 5/02 |
| 2020/0202206 | A1* | 6/2020 | Rummens ............... G11C 11/54 |
| 2020/0372335 | A1* | 11/2020 | Ambrogio ............. G06N 3/084 |
| 2021/0065794 | A1* | 3/2021 | Burr ................... G11C 13/0004 |
| 2021/0232903 | A1* | 7/2021 | Friedman ............... G06N 3/065 |
| 2021/0406694 | A1* | 12/2021 | Kim ........................ G06N 3/045 |
| 2025/0336459 | A1* | 10/2025 | Watanabe .............. G06N 3/006 |

OTHER PUBLICATIONS

Masanet, E.; Shhehabi, A.; Lei, N.; Smith, S.; Koomey, J. Recalibrating global data center energy-use estimates. Science, Feb. 28, 2020, vol. 3667, 984-986.

\* cited by examiner

[Fig. 1]
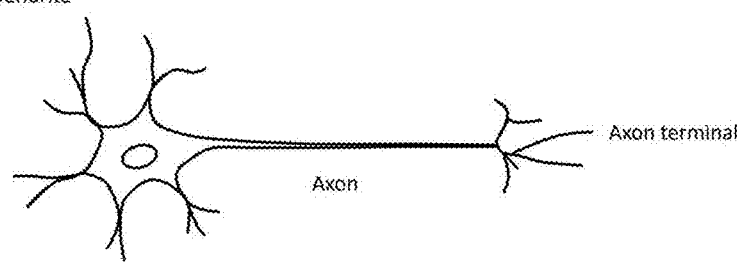
[Fig. 2]
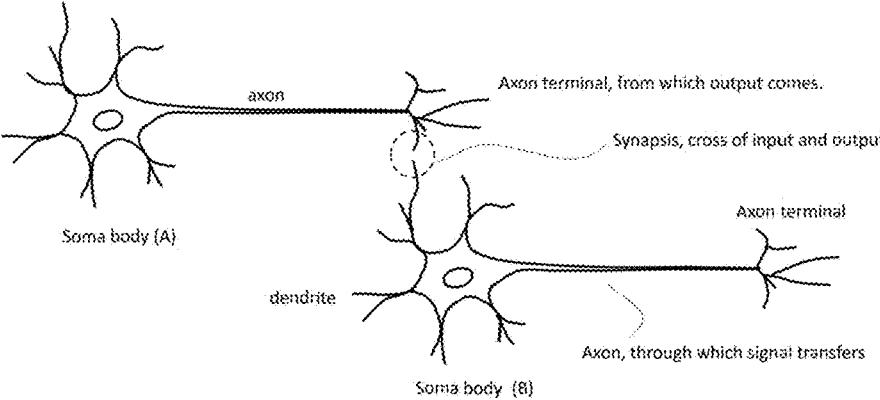
[Fig. 3]
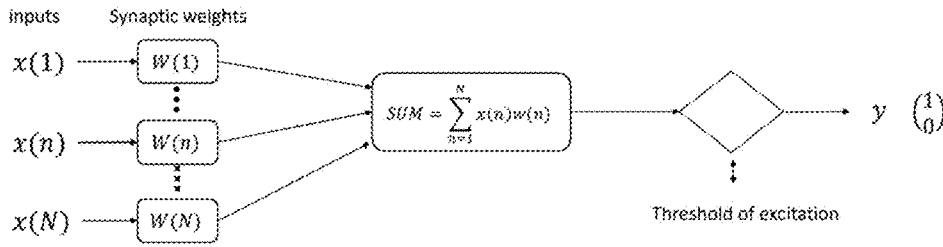
[Fig. 4]
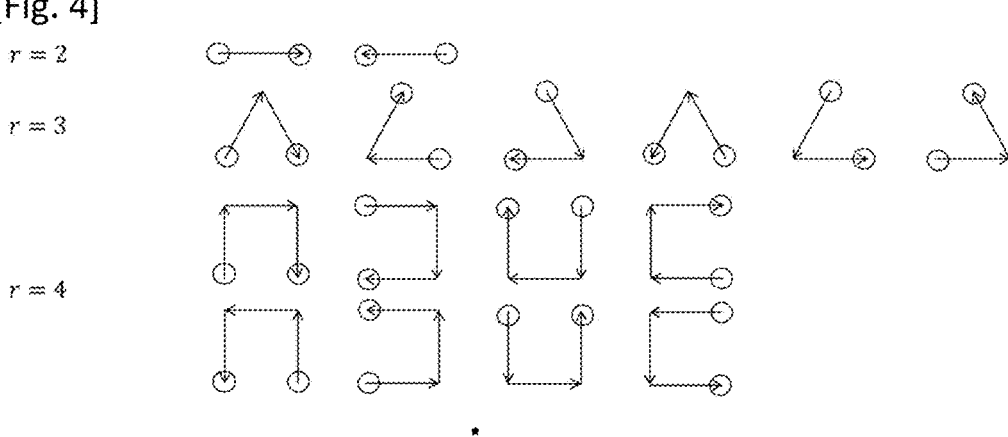

[Fig. 5]
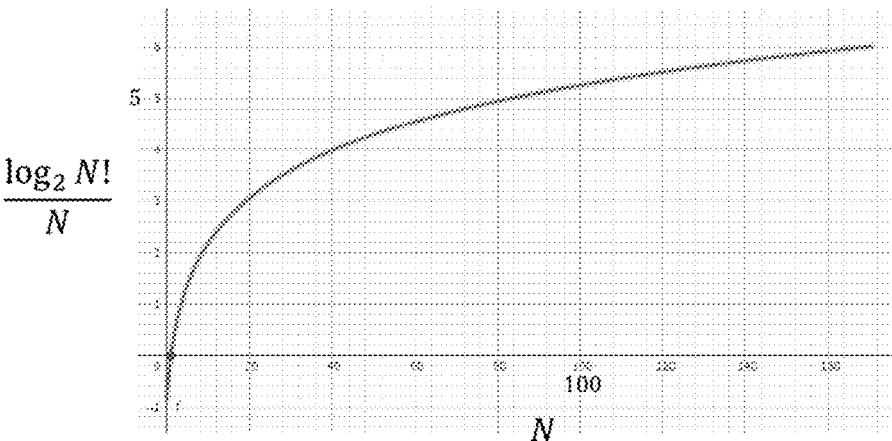
$$\frac{\log_2 N!}{N}$$
$N$
[Fig. 6]
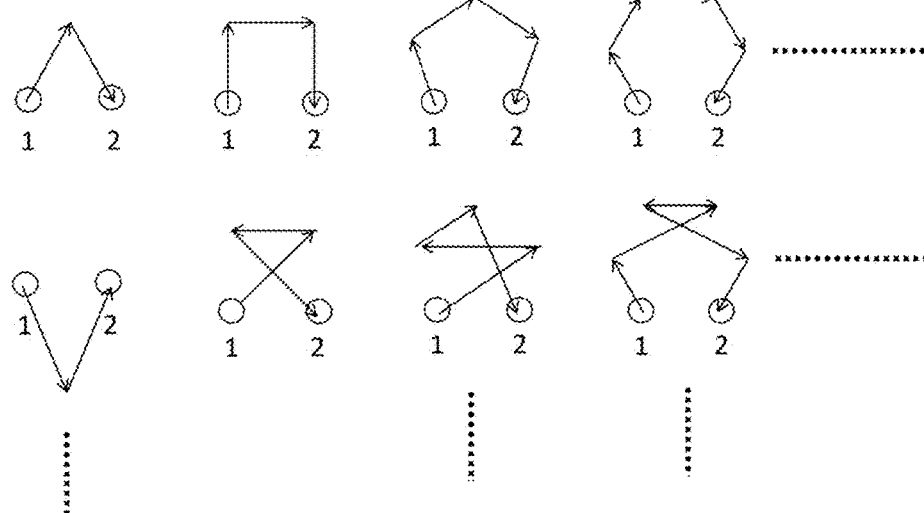
[Fig. 7]
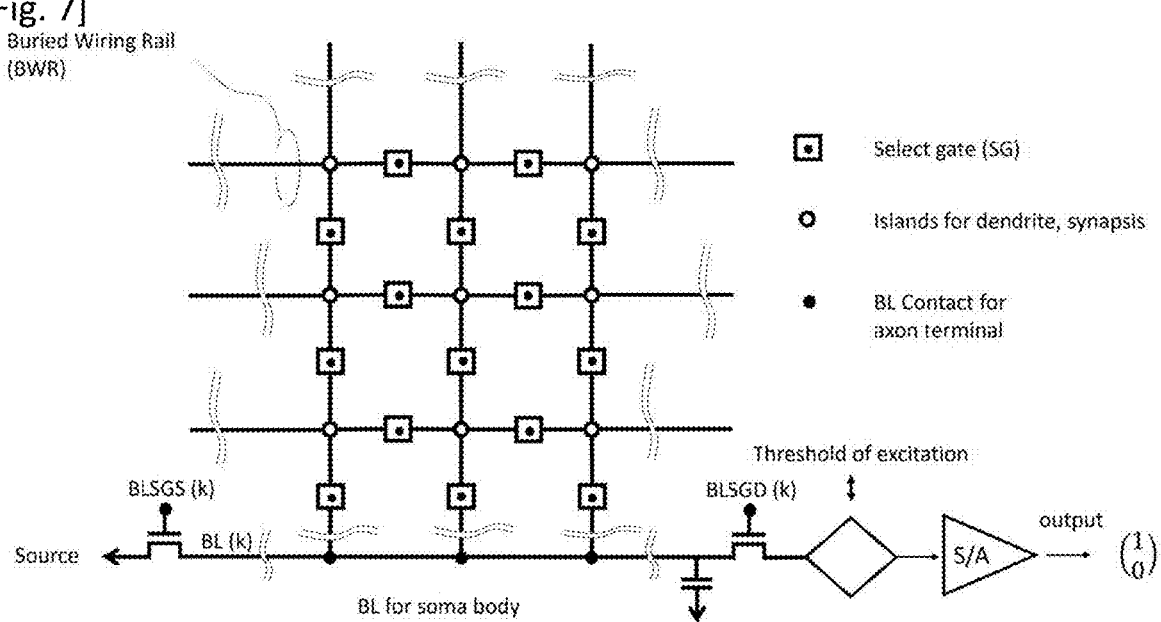

[Fig. 8]
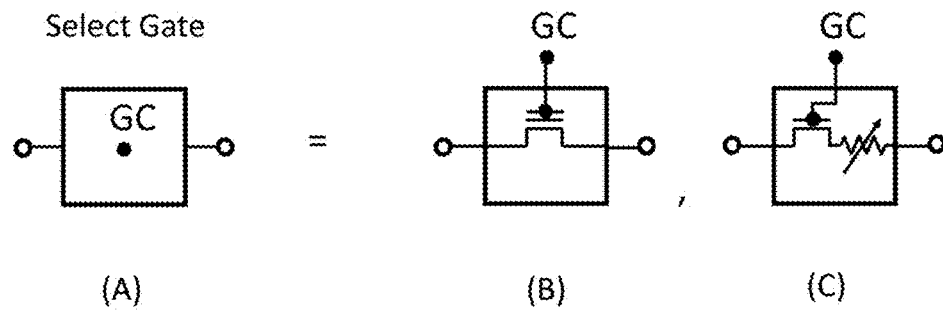
Select Gate
(A)                    (B)                    (C)
[Fig. 9]
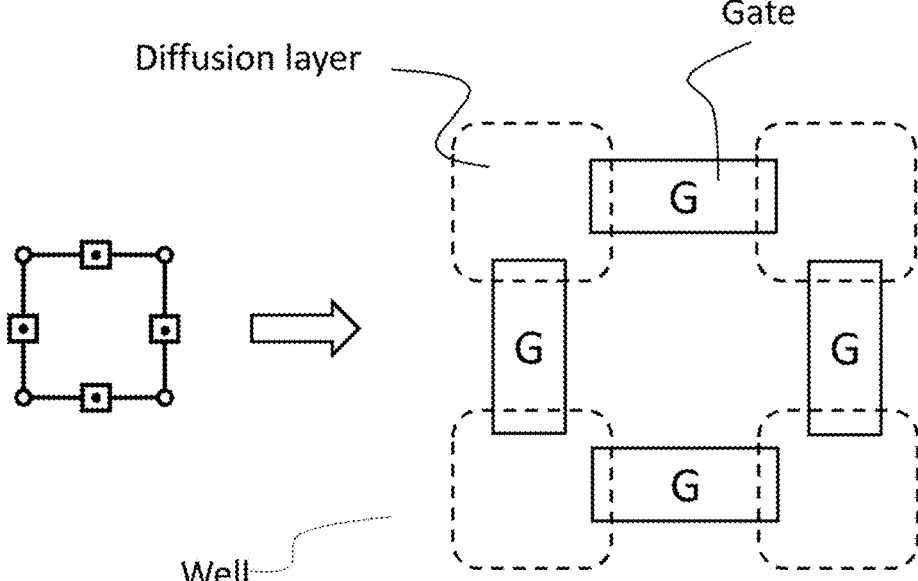
Diffusion layer
Gate
Well
[Fig. 10]
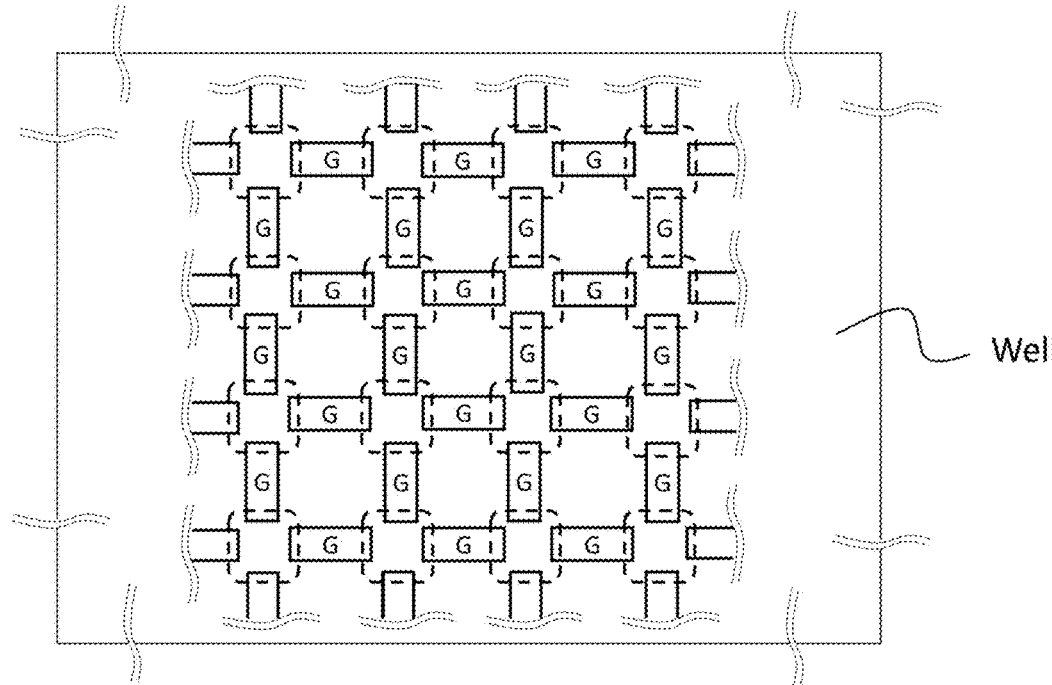
Well

[Fig. 11]
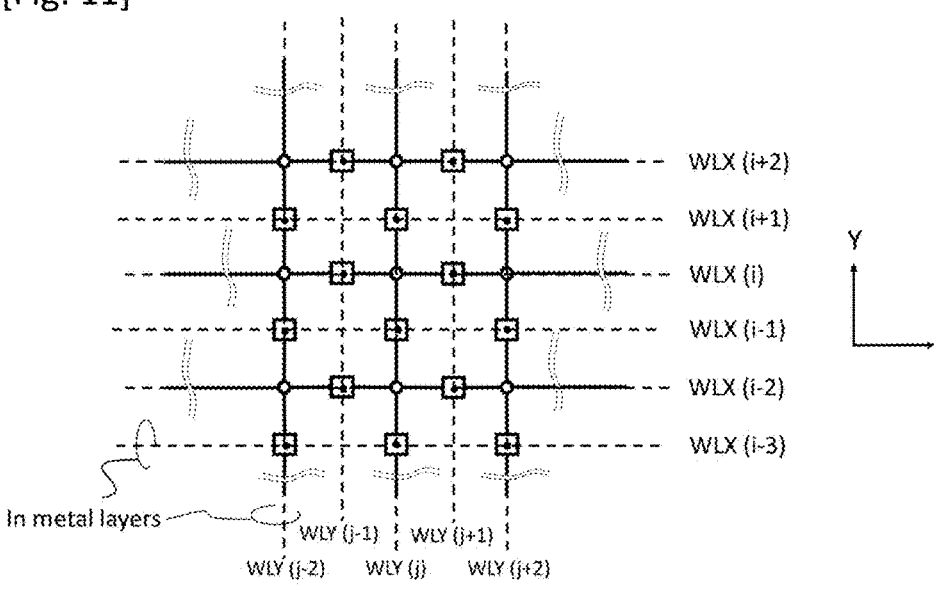
[Fig. 12]
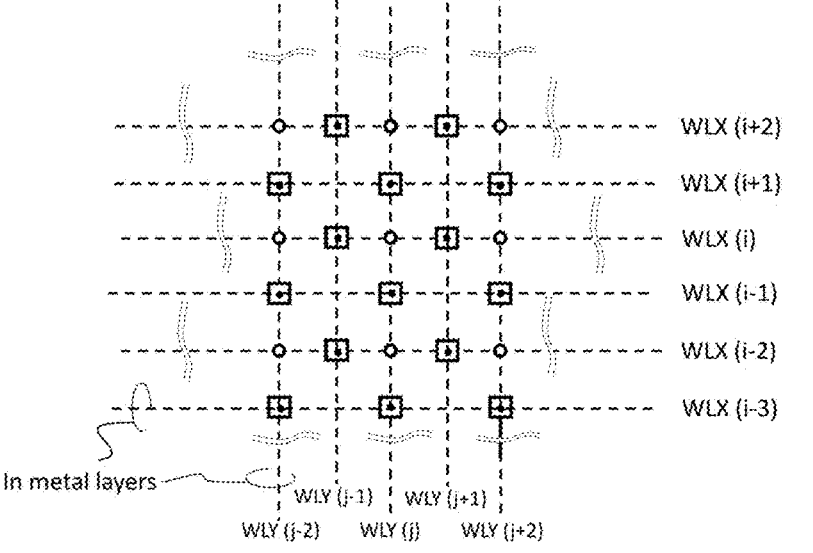
[Fig. 13]
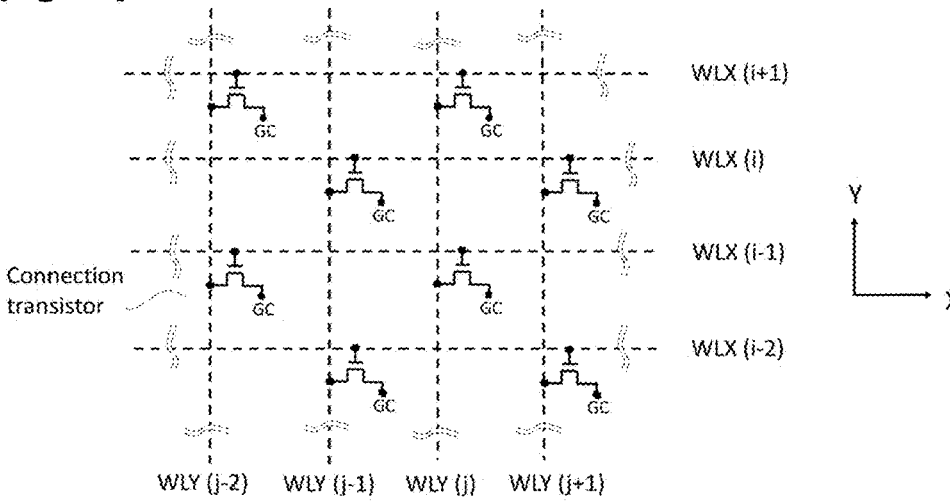

[Fig. 14]
[Fig. 15]
[Fig. 16]
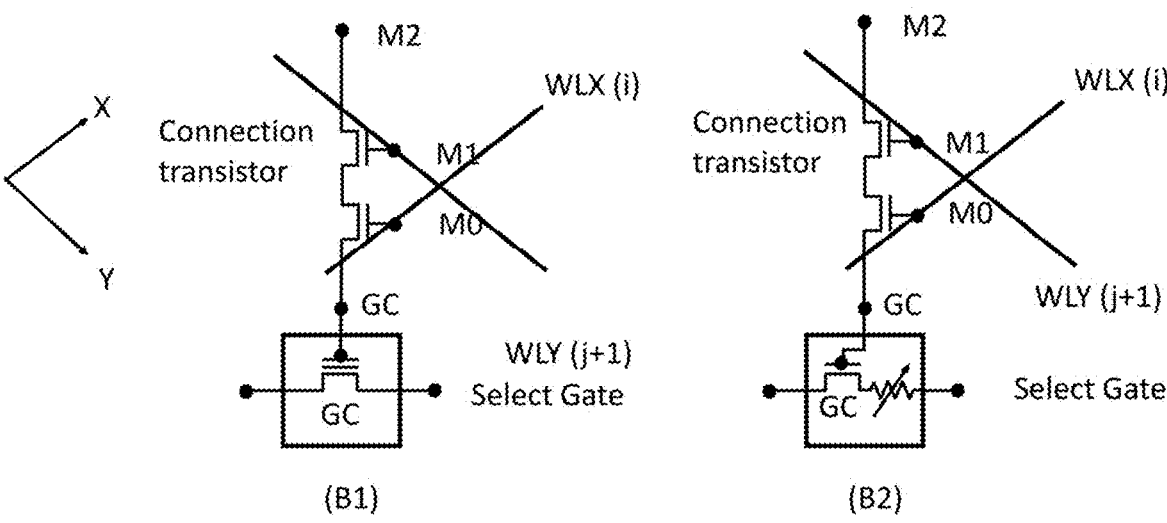

[Fig. 17]
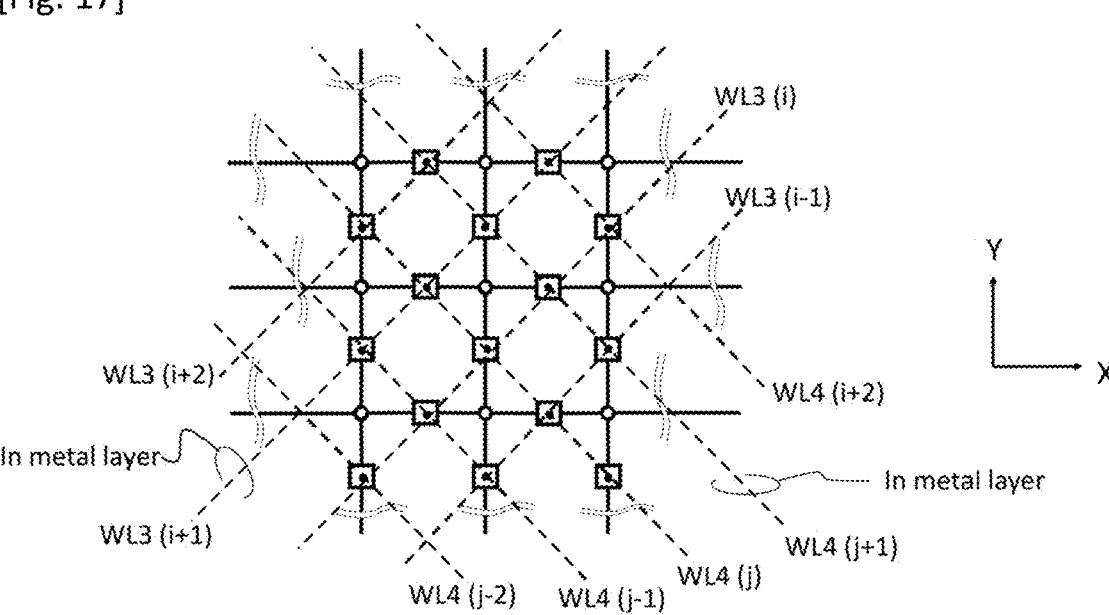
[Fig. 18]
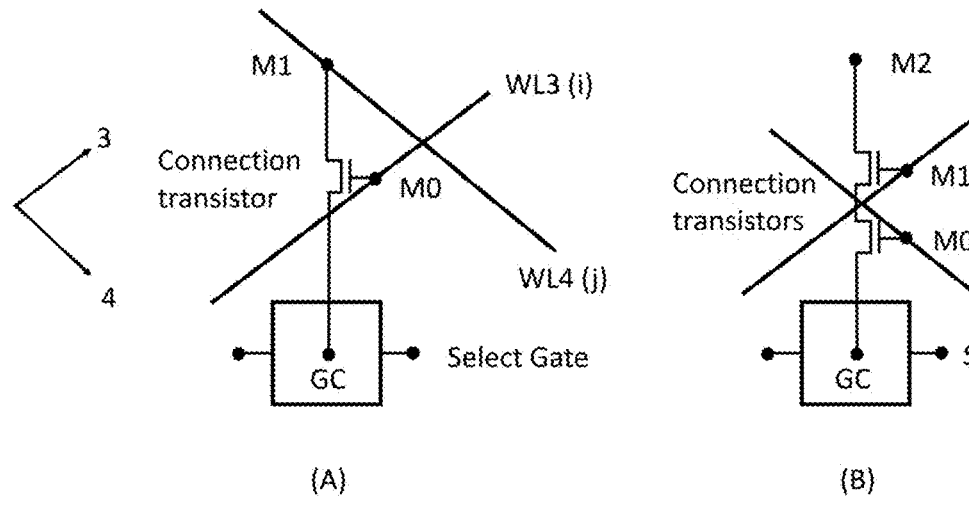
(A)                              (B)
[Fig. 19]
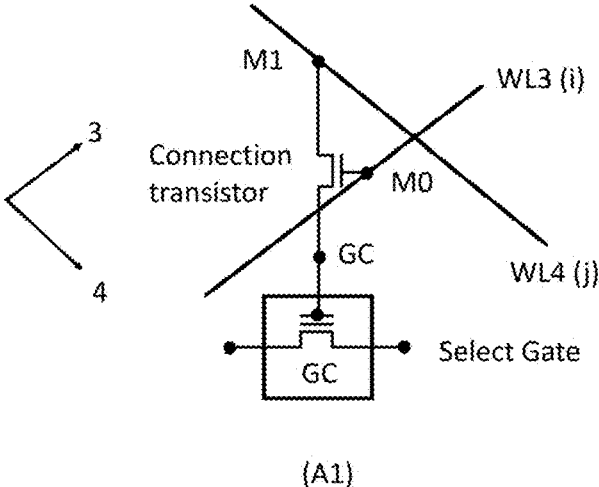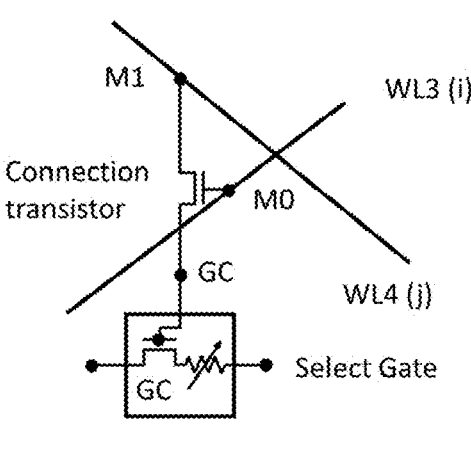
(A1)                             (A2)

SILICON BRAIN

FIELD OF THE INVENTION

The present invention relates to a technology to integrate a neural network on a silicon chip (IC chip).

DESCRIPTION OF RELATED ART

In the method of computational processing using the conventional semiconductor, a memory device (memory) and an arithmetic processing unit (CPU etc) operate in cooperation. The memory device (semiconductor memory) is composed of an assembly (array, cell array, or memory cell array) of memory cells (memory cells, bit cells or just to be called cells). Each cell has, at least, a source, a drain and a gate (or control gate). Sources and drains can be respectively connected to a source line and bit line. Gates are respectively connected to word lines. Such a connection is, in general, made from a contact. For example, it is a word line contact (terminal) or bit line contact (terminal). If an assembly of those cells is distributed on a two-dimensional plane, the access to each memory cell can be performed using word lines (WL) and bit lines (BL), which are respectively laid out along the x-axis and the y-axis and perpendicular to each other. For example, the address of a memory cell, which is allocated at a cross-point of the A-th word line and the B-th bit line, is (A, B). This is called the address of memory cell. However, A is especially called the address on the x-axis (X-address) and B is especially called the address on the y-axis (Y-address).

Following Moore's law (see non-patent document 1), it has been a long-term trend to integrate as many memory cells as possible on the surface of silicon wafer using the semiconductor fabrication process. However, in recent years (after 2015), it has been difficult to increase the integration on a two-dimensional plane, and then it is being a major trend for the method to integrate memory cells in a three-dimensional space even in the mass-production level. Hence, the address can be represented by (A, B, C). However, C is an address on the z-axis that is perpendicular to the XY-plane (Z-address).

However, whether two-dimensional or three-dimensional, in the information recording method of the current semiconductor memory devices, a memory cell serves as a unit. In the case that each memory cell has two values of 0 and 1, we can say that there is 1 bit of memory capacity (information quantity to be stored) per cell. If there are two cells like this, we can say that the memory capacity is 2 bits. There are thus four cases of the set of 0 and 1—(00), (01), (10), and (11). This number of cases can be calculated by 2 to the power of 2. If a cell array is composed of N memory cells, then the memory capacity of that cell array is N bits. This number of cases can be calculated by 2 to the power of N.

Accordingly, the information quantity of the conventional semiconductor devices (bit number) is what describes the number of cases using the logarithm to base 2. Even using so-called multi level cells, the base number of the logarithm just becomes 4 or 8. Since those logarithms can be always converted to that to base 2, information quantity can be described by bit with no change even using the technology of the multi level cells.

On the contrary, the human brain is not composed of memory cells. If we could tell what corresponds to a memory cell in the human brain, then it would be a soma body which composes a part of neuron. However, the human brain will not store information of 0 or 1 in this soma body.

As simply illustrated in FIG. 1, in general, a neuron is composed of three parts such as a soma body, multiple (for example, several tens) dendrites, and an axon. Soma body can receive external inputs from those multiple dendrites. Axon is generally expanded longer than dendrites and branches its terminal to several tens to several hundreds. Those branched terminals of axon are called axon terminals.

As illustrated in FIG. 2, an axon terminal can approach a dendrite of another soma body to form a junction. This junction is called synapse.

Suppose that there are soma body A and soma body B. Soma body A can receive plural inputs x(n) via plural dendrites (n), where n is an integer ranging from 1 to N. Soma body A allocates the weight W(n) to the input (n), respectively. The signal, to be added according to these weights, is depicted as SUM. This SUM is transferred to one of axon terminals through the axon. If SUM is greater than a threshold (threshold of excitation), then the neuron generates action potential to drive a synopsis so that neurotransmitters are transferred from soma body A to soma body B.

This threshold is changeable by the repetition of signal transfer. In other words, learning by repeating experiences makes synapsis stronger, disconnected, or replaced. The reduction of the threshold can explain the reason that synapsis becomes stronger. The rise of the threshold can explain the disconnection of synapsis. The replacement of synapses can be explained by the redistribution of thresholds.

This is modeled in FIG. 3. Output y is 1 (y=1) when neurotransmitters transfer. Otherwise, y=0. This model is called perceptron, which has been extensively used in machine learning and deep learning.

There are mainly two methods to realize a perceptron on computers.

In the traditional method, input x(n), weight(n), SUM, thresholds, output y are all described using bits. That is, perceptron is a computer program.

In this method, there is a problem placing a high load on computers. Both the improvement of computation processing speed and the reduction of power consumption are required more than before. Deep learning and machine learning demand computers to process enormous amounts of data in the blink of an eye. Hence, if computations with large loads are globally performed, then the power consumption of data centers explosively increases to make it difficult to realistically operate data centers. Furthermore, a risk to accelerate global warming is being to be supposed. (see non-patent document 2)

The main reason to the limitation in computational speed is an overload on data transmissions between an arithmetic operational unit and a main memory. Though the speedup of the arithmetic operational unit is still possible, the transmission speed of data bus between the arithmetic operational unit and the main memory has reached its peak. This is called von-Neumann bottleneck (or memory bus problem).

The main reason for the power consumption increase is that the current major main memory is a kind of volatile memory, called the dynamic random-access memory (DRAM). Hence, refresh of recorded data causes nonnegligible power consumption.

In a recent new trend, a perceptron is tried to be realized on a semiconductor chip to skip the von-Neumann bottleneck and to reduce power consumption. However, neural networks of the human brain are, in general, designed to form a synapsis between two undetermined neurons. In other words, it is possible to closely distribute perceptrons on pre-determined addresses on two-dimensional or three-dimensional spaces using the present semiconductor technology, but it is not easy to reproduce a synopsis between arbitral neurons and to freely replace synapses regarding the learning.

And, as mentioned above, while information is stored by bit unit in the conventional memory architecture, information is described by junctions of neurons (neural network), that is, synapsis, in the human brain. That is, performing deep learning or machine learning on a program written by bit information results in having coded a program to model a unit of neural network (perceptron). This causes a big loss in information processing.

For example, let us assume that a program of a perceptron can be written within 1,000 lines. If the information quantity per line is 80 Bytes (1 Byte is 8 bits), then information quantity of 80 K Bytes is necessary to reproduce a perceptron by a computer program. Even though it can be compressed to $\frac{1}{10}$ by compilation, it is still 8 K Bytes. If we can describe it using 100 bits on a semiconductor chip, then the computer program wastes 640-fold quantity of information per perceptron.

It is said that the number of neurons is about 86 billion in the human brain (cerebrum and cerebellum). Let us suppose that human beings use 1% of it for 1 hour. In addition, let us assume that the number of neurons and that of perceptrons are almost the same. Wasted quantity of information to realize an artificial intelligence, which has an ability in as the same level as human beings, can be calculated by 860 million times of (8 K Bytes-100 bits). It is roughly estimated to be 7 T Bytes per hour. Hence, the computers are forced to process such an enormous quantity of information wastefully.

Deep learning or machine learning has not been an artificial intelligence which can compete with the human brain, yet. Accordingly, it can be regarded that information quantity, which computers are forced to process wastefully, would further increase as artificial intelligence is developed. Then, if such an artificial intelligence spreads, what is the global population of artificial intelligence? If it is 1 million, then the information quantity of 7 Exa bytes would be wasted per hour all over the world. Even if the conversion of the fossil fuel to the natural energy is drastically proceeded, even if the ratio of the fossil fuel to be consumed for artificial intelligence by the world's computers is suppressed to be 30%, then the fossil fuel would be wastefully combusted to process the information quantity of 2.1 Exa Bytes per hour. In other words, if we cannot substantially reduce the power consumption for information processing, then the spread of artificial intelligence would compete with the suppression of climate change. If the suppression of climate change is prioritized, then the number of advanced artificial intelligence that can compete with the human being or more is limited. Hence, some mega companies and some super-powers would dominate the numerous computing abilities so that they would play out the emission quota of carbon-dioxide. This must not be a bright future.

Next, let us compare information quantity by network and bit.

The scholar of network is called graph theory in mathematics. In general, the network is what is made by linking plural points by lines. On the contrary, information is processed only using points in the information processing with the unit being bit.

Above-mentioned points are called vertexes or nodes. The lines linking nodes or vertexes are called edge or link. Node and link is terms which are popular in physics, and respectively indicate vertex and edge.

Inherently, the network is complicated. Hence, the certain level of constraints is necessary to precisely evaluate the quantity of information of network.

When arbitral two points (1 and 2) are linked, a network, wherein a link orienting from 1 to 2 and that orienting from 2 to 1 are different, is called an oriented network. Otherwise, it is called an unoriented network. In an oriented network, as illustrated in FIG. 4, the links are depicted by arrows. Initial and end points are depicted by open circles. See the case of r=2 in FIG. 4. There are two cases made of two open circles and one arrow, where r is the number of nodes to be linked.

When r=3, two arrows are connected to link the initial and end points with the number of cases being 6. When r=4, three arrows are connected to link the initial and end points with the number of cases being 8. The number of cases, wherein r nodes are linked with the total number of nodes being N, can be represented by the product of the permutation of N and r, P (N, r), and r. The number of cases in the network with this constraint is what is obtained by adding this product from r=3 to N and further adding P (N, 2). It is self-evident that this is greater than N-factorial (N!).

Though this does not cover the entire possibilities of all networks, it is possible to prove that even the information quantity of network under such a strong constraint is greater than the information quantity of bits.

Suppose that N nodes are distributed on a memory cell array. The information quantity of bits can be simply N bits. On contrary, the information quantity demonstrated in FIG. 4 is greater than log (2, N!), where log (2, x) is the logarithm of x to base 2.

Using the Starling formula, in the case that N is great enough (practically, greater than 20), log (2, N!) is (N log (e, N)−N)/log (e, 2), where log (e, x) is the logarithm of x to base e. Dividing this value by N, it turns out (log (e, N)−1)/log (e, 2). This value is greater than 1 while N is great enough.

Converting from 128 G bit DRAM, the number of nodes (N) is roughly estimated to be 10 to the power of 11. Since log (2, e) is about 1.9, as seen in FIG. 5, it is self-evident that the information quantity of network shown in FIG. 4 is much greater than that of bits.

Subsequently, a network can store information of different paths with the same initial points and the same end points.

FIG. 6 describes plural examples of paths from the initial point (1) to the end point (2). From the left, there are the cases with two links, those with three links, those with four links, those with five links, etc.

In the case of two links, there are an intermediate node other than the initial point (1) and the end point (2). In some cases, the signal flowing into the end point (2) may be changeable with respect to which node is this intermediate node.

In the case of three links, there are two intermediate nodes between the initial point (1) and the end point (2). In some cases, the signal flowing to the end point (2) may be changeable with respect to the permutation of addresses of these two intermediate nodes. Furthermore, we should consider the cases where an address of an intermediate node changes.

In the case of four links, there are 3 nodes between the initial point (1) and the end point (2). In some cases, the signal flowing to the end point (2) may be changeable with respect to the permutation of addresses of these three intermediate nodes. Furthermore, we should consider the cases where an address of an intermediate node changes.

In the case of five links, there are 4 nodes between the initial point (1) and the end point (2). In some cases, the signal flowing to the end point (2) may be changeable with respect to the permutation of addresses of these three intermediate nodes. Furthermore, we should consider the cases where an address of an intermediate node changes.

Like this, it can be simply found that the information quantity that a network can record is greater than that of bits with the node number being the same.

The currently most spread computers are, at least, substantially, what is made of two connected silicon chips, if the computers are the turing machines.

In other words, the object of this invention is to integrate a neural network on a silicon chip with no basis of the bit-based arithmetic operation.

SUMMARY OF THE INVENTION

Problem that the Present Invention Solves

The present invention is made considering the above-mentioned considerations and produces a method to integrate an information processing system of network on a silicon chip.

Method to Solve the Problem

The present invention adopts the following methods to solve the above-mentioned problem.

The method proposed by the present invention is characterized by having, plural islands, which are periodically distributed along a first direction and a second direction on a surface of semiconductor, first and second links, which are respectively arrayed between two islands among the said plural islands along the said first and second directions, a first word line along a third direction, and a second word line along a fourth direction, wherein the said plural islands respectively have diffusion layers formed on the said surface of semiconductor, the said first link is a first select gate bridging two islands, which are adjacent to each other along the said first direction, among the said plural islands, the said second link is a second select gate bridging two islands, which are adjacent to each other along the said second direction, among the said plural islands, the said first and second select gates respectively have select gate contacts, and the said select gate contacts are selected by the said first and second word lines, wherein the said first select gate is arrayed along the first direction in one of the said plural islands, the said second select gate is arrayed along the second direction in one of the said plural islands, the said first word line is on a first wiring layer, and the said second word line is on a second wiring layer, Furthermore, the said method is characterized by having a junction transistor, wherein the said junction transistor has a junction gate and two terminals, the said junction gate is connected to the said first word line, one of the said two terminals is connected to the said second word line, and the other of the said two terminals is connected to the said select gate contact.

Or furthermore, the said method has two junction transistors which are connected in series each other, the said two junction transistors have two junction gates and two terminals, respectively, one of the said two junction gates is connected to the said first word line, and the other of the said two junction gates is connected to the said second word line.

And furthermore, the said method has a bit line and a third select gate, wherein the said third select gate has a select gate contact and two terminals, one of the two terminals of the said third select gate is connected to the said bit line and serves as a bit line contact, the other of the two terminals of the said third select gate is connected to one of the said plural islands, the said select gate contact of the third select gate is selected by the said first and second word lines, and the one of the said two terminals is connected to the said select gate contact.

And furthermore, the said method has an operational amplifier, wherein the said operational amplifier is connected to the said bit line, compares a potential of the said bit line with a predetermined threshold voltage, outputs data 1 if the potential of the said bit line is higher than the said threshold potential or outputs data 0 if the potential of the said bit line is lower than the said threshold potential, and furthermore, the said method has a first and second bit-line select gates, and a source line, wherein the said first bit line select gate is between the said bit line contact and the said operational amplifier, and the said second bit line select gate is between the said bit line contact and the said source line.

And furthermore, the said method has a capacitor, wherein the said capacitor is between the said first and second bit-line select gates and is connected to the said bit line.

The Effect of the Invention

By the present invention, it is possible to reproduce the information processing method of the human brain (simply, Neural Net) on a silicon chip (IC chip) without the conversion to the bit data. Below the best embodiment to carry out the present invention is described in concrete.

THE BEST EMBODIMENT TO CARRY OUT THE INVENTION

As mentioned above, the present invention produces the method to reproduce the information processing method of the human brain on a silicon chip (IC chip) without the conversion to the bit data (with no basis of computer programs). Below it is described concretely using drawings.

FIG. 7 is a drawing to illustrate an example of a circuit, wherein the present neural network is integrated on an IC chip.

A white dot depicts an island on a circuit, which corresponds to a dendrite or synapse. A black dot depicts a bit line contact, which corresponds to an axon terminal. A white open box depicts a select gate (SG), wherein a black dot depicts a gate contact of the select gate (a select gate contact GC).

An axon terminal and a dendrite adjoin at a bit line contact to form a synapsis. A signal is input to a soma body through this synapsis. In this figure, as an example, three axon terminals (bit line contacts) are parallelly connected to the k-th bit line BL (k). That is, this bit line corresponds to a soma body. It is not always that there is only one soma body. In general, this k is a natural number.

A signal from a dendrite is input to the soma body as a potential change of bit line (soma body). A capacitor is connected to the bit line BL (k) to store (stabilize) this potential change temporarily. In an integrated circuit, such a capacitor can be constructed using parasitic capacitors, etc. Or it is also possible to additionally integrate a capacitor.

A bit line contact is further sandwiched between source-side bit line select gate BLSGS (k) and drain-side bit line select gate BLSGD (k). It is also preferable that the said capacitor is sandwiched between these two bit-line select gates. There is a source at the source-side. It is preferable that this source-side bit line select gate is set up between this source line and a bit line contact.

We can set up a circuit such as an operational amplifier, etc. to compare a threshold (threshold of excitation) and a bit line potential, and a sense-amplifier to output data 1 or 0 to an external circuit by tuning a signal from a circuit such as this operational amplifier, etc. That is, the sense-amplifier (S/A) amplifiers the signal from the operational amplifier to output data 1 if the bit line potential is higher than the threshold (threshold of excitation). Otherwise, the S/A outputs data 0. If the performance of the operational amplifier is sufficient so that an output can be clearly distinguished to data 1 or data 0, then the sense-amplifier can be omitted. Like this, it is preferable that the drain-side bit line select gate is set up between a circuit such as the operational amplifier, etc. and the bit line contact.

Moreover, a select gate which is not directly connected to the bit line BL (k) is arrayed between islands to disconnect or connect the link between the islands. That is, the islands are linked when the select gate is on and disconnected when the select gate is off. In general, it is preferable that two islands bridged by a link are adjoining each other.

That is, an island serves as a node of network. A select gate which is on serves as a link of network. An island can be connected to a buried wiring rail (BWR) buried in a semiconductor substrate.

FIG. 8 is a drawing to illustrate an example of a select gate of the present invention.

(A) in the left is an equivalent circuit model of the select gate and so forth, which is adopted in FIG. 7. White dots in both left and right ends depict islands (nodes) which serve as a dendrite or an axon terminal. Black dot in the center depicts a select gate contact (GC). The select gate is composed of a select gate contact GC and two terminals, between which an electric current can flow. If one of these terminals is connected to an island (node), then the terminal serves as an island in the circuit. If one of those terminals is connected to a bit line, then the terminal serves as a bit line contact in the circuit. The (B) illustrates a case that this select gate is a non-volatile memory cell which has a charge storage layer. That is, the threshold voltage Vt of this non-volatile memory cell is stored as the on-off of the link in FIG. 7. If Vt is higher, then the link is off. If Vt is lower, then the link is on. That the link is on means a state that the link is connected, so that the white dots (nodes) in the left and right ends are linked (connected). That the link is off means a state that the link is disconnected, so that the white dots (nodes) in the left and right ends are unlinked (disconnected).

The (C) illustrates a case that this select gate is a memory cell which has a variable resistor. As the variable resistor, magnetic variable resistor, phase change variable resistor, ferroelectric variable resistor, metal-insulator variable resistor, etc. can be adopted. That is, the threshold resistance Rt of this variable resistive memory cell is stored as the on-off of the link in FIG. 7. If Rt is higher, then the link is off. If Rt is lower, then the link is on. That the link is on means a state that the link is connected, so that the white dots (nodes) in the left and right ends are linked (connected). That the link is off means a state that the link is disconnected, so that the white dots (nodes) in the left and right ends are unlinked (disconnected).

FIG. 9 is a drawing to illustrate an example of the method to integrate the network of the present invention.

An island (node) in FIGS. 7 and 8 is an area on the surface of semiconductor, which includes a diffusion layer formed thereon, or the diffusion layer itself in this figure.

The surface of channel is covered by gate oxide, above which a gate (G) is formed to bridge the said two diffusion layers. It is preferable that gate (or gate electrode) is made of highly doped polysilicon or metal, etc.

FIG. 9 is one of layouts having the good efficiency to integrate nodes (diffusion layers) and gates. The left is an equivalent circuit model, which illustrates one unit cut out from the layout shown in FIG. 7. The right is to illustrate the integration method to carry it out. In a well formed on the surface of semiconductor, a unit of checkerboard like layout, which is made from four diffusion layers (nodes) and four gates (links). Here, the checkerboard-like means that two matrices (parts) are periodically laid out along two directions which are not parallel each other, respectively. If the diffusion layer is N+ type, then the well is P type. If the diffusion layer is P+ type, then the well is N type. In this layout, a buried power rail (BPR) is unnecessary. An island arrays a gate along the first direction (for example, the X-axis direction) and another gate along the second direction (for example, the Y-axis direction). Or islands adjoining along the first direction are bridged by a gate, and islands adjoining along the second direction is bridged by another gate.

FIG. 10 is a drawing to illustrate an example of a method to integrate networks of the present invention.

In FIG. 10, units of FIG. 9 are laid out lengthwise and breadthwise. Many of the above-mentioned units are integrated on a common well (Well).

To operate the equivalent circuit of FIG. 7, each select gate (link) must be able to freely change on and off.

In this figure, select gates are set up between islands (diffusion layers) are laid out in a checkerboard-like manner on the well. That is, the select gate contacts (GC) of select gates (G) are laid out checkerboard-like on the surface of semiconductor. It must be able to freely select any of them. There is not the gate wiring like this in the usual IC chip products.

FIG. 11 is a drawing to illustrate an example of wiring layout of the present invention.

An island (node) is depicted by a white dot. The link connecting an island (node) to another island (node) is depicted by a select gate shown in FIG. 8 (A). The select gate has a select gate contact (GC). As a characteristic of the present invention, each select gate must be accessible at will. Access at will means that we can choose an arbitral select gate, on which we can change on and off freely.

There is a select gate on a cross-point of an X-axis word line WLX depicted by a broken line and a Y-axis word line WLY depicted by a broken line similarly depicted by a broken line. The angle of WLX and WLY is arbitral ranging from 0 to 180 degrees. In general, it is preferable to be 90 degrees. Anyway, at least two directed word-lines, which are not parallel each other, are necessary to choose a select gate contact.

Since the links (bold line) and word lines (broken lines) are overlapped in FIG. 11, the drawing with removing the links (bold lines) from FIG. 11 is shown in FIG. 12.

Along both X-axis and Y-axis directions, the word lines are allocated with numbers, respectively. Along the j-th Y-axis word line WLY(j), links (select gates) are arrayed alternatively on WLXs. In a similar way, along the i-th X-axis word line WLX (i), links (select gates) are arrayed alternatively on WLYs.

That is, the select gates are deployed at a point which WLX (i) crosses with WLY (j−3), WLY (j−1), WLY (j+1) . . . . These cross-points where select gates are set up are called select cross-points.

Metal wiring such as word lines and bit lines can be formed in the wiring process after forming the said node (diffusion layer) and the select gate contact GC of the said link (select gate), etc. Accordingly, the wiring layers are formed above the select gate contact GC.

In general, the plural wiring layers are laminated. X-axis word line and Y-axis word line are formed in separate layers in fact. For example, in the case that the X-axis word line WLX is formed on the k-th metal layer (Mk layer), the Y-axis word line WLY is formed on the k'-th metal layer (Mk' layer). In general, k and k' are two different integers.

FIG. 13 is a drawing to illustrate an example of the method to connect WLX (i) on the Mk-th layer and WLY (j+1) on the Mk'-th layer at a selected cross-point.

Transistor for wiring connection (connection transistor) has a connection gate and two terminals between which an electric current can flow. The said connection gate is connected to WLX (i) on the Mk-th layer. One of the two terminals of the said connection transistor is connected to WLY (j+1) on the Mk's layer. The other is connected to the selected gate contact GC of the selected gate. Though it is not especially illustrated because it is self-evident, WLY (j+1) can be connected to the gate of a connection transistor (connection gate) and WLX (i) can be connected to one of the two terminals of the said connection transistor.

A connection transistor is arrayed on a selected cross-point. That is, it may be located on a cross-point which WLX (i) intersects WLY (j−3), WLY (j−1), or WLY (j+1) . . . . Or it may be located on a cross-point that WLY (j) intersects WLX (i−3), WLX (i−1), or WLX (i+1) . . . . That is, to select one of WLXs is to alternatively select WLYs intersecting the selected WLX. To select one of WLYs is to alternatively select WLXs intersecting the selected WLY. The reason for the alternation like this is self-evident if we see FIG. 7. That is, there are both select gates bridging (linking) two adjoining islands along the first direction (X-axis direction as an example) and select gates bridging (linking) two adjoining islands along the second direction (Y-axis direction as an example).

FIG. 14 is a drawing to illustrate an example of connection transistor. FIG. 14 (A) corresponds to an example of connection transistor in FIG. 13, and (B) corresponds to another example.

(A) illustrates an example of forming a selected cross-point using a connection transistor. That is, it can form a connection at the selected cross-point using one connection gate and two terminals (diffusion layers as an example). (B) illustrates an example of forming a selected cross-point using two connection transistors which are connected in series. That is, since two of four terminals (diffusion layers as an example) are shared or short-circuit, it can form a connection at the selected cross-point using two connection gates and the remaining two terminals.

Use k=0 and k'=1 for the ease of illustration. In (A), WLX (i) on the M0-th layer is connected to the connection gate of the connection transistor. WLY (j+1) on the M1-th layer is connected to one of terminals of the connection transistor. The other terminal remaining is connected to a select gate contact GC of a select gate. By applying a high voltage on WLX (i) to turn on the connection transistor, then the voltage of WLY (j+1) is applied to the selected gate contact GC. In (B), WLX (i) on the M0-th layer is connected to one of the connection gates and WLY (j+1) on the M1-th layer is connected to the other of the connection gates. One of the two terminals is connected to the select gate contact GC, and the other is connected to a power supply, etc., which is separately connected to the M2-th layer. By applying a high voltage on both WLX (i) and WLY (j+1) to turn on the two connection transistors, the voltage of the power supply that is separately connected to the M2-th layer is applied to the selected gate contact GC.

FIG. 15 illustrates two examples which correspond to FIG. 14 (A). (A1) illustrates a case where the select gate is FIG. 8 (B) (a non-volatile memory cell). (A2) illustrates a case where the select gate is FIG. 8 (C) (a variable resistor memory cell).

FIG. 16 illustrates two examples which correspond to FIG. 14 (B). (B1) illustrates a case where the select gate is FIG. 8 (B) (a non-volatile memory cell). (B2) illustrates a case where the select gate is FIG. 8 (C) (a variable resistor memory cell).

The metal wirings shown in FIG. 12 are arrayed along the same direction as the link on the backing. However, it may be approved that the metal wirings are arrayed along a different direction from the link on the backing, since the metal wirings are in different layers from the link on the backing.

FIG. 17 is a drawing to illustrate an example where the third word line WL3 along the third direction that is different from both the X-axis and the Y-axis on the XY-plane and the fourth word line WL4 along the fourth direction that is different from all the X-axis and the Y-axis on the XY-plane and the third direction are adopted. That is, both WL3 and WL4 are arrayed along different directions, both of which directions are different from the links on the backing. Considering the integrability, it may be preferable that WL3 and WL4 are perpendicular to each other.

In this figure, both WL3 and WL4 are depicted by broken lines. It may be preferable that the X-axis and the Y-axis are perpendicular to each other and the angle of the X-axis and WL3 is 45 degrees. In practice, however, it is not easy to fabricate the wiring layers with the angle of X-axis and WL3 being 45 degrees. Hence, it may be preferable to fabricate the wiring layers with the angle of X-axis and WL3 ranging from 30 to 60 degrees.

As similar to the above example, WL3 and WL4 are formed on wiring layers. For example, WL3 is formed on the Mk-layer and WL4 is formed on the Mk' layer. A select gate is located at an address which corresponds to a cross-point of WL3 and WL4 (selected cross-point).

The connection gate of a transistor for connecting the wirings (connection transistor) is connected to WL3 (i) on the Mk-layer. One of the terminals of the said connection transistor is connected to WL4 (j) on the Mk'-layer. The other of the terminals of the said connection transistor is connected to a gate contact GC of a select gate. Though it is not especially illustrated since it is self-evident, it may be approved that WL4 (j) is connected to a connection gate of a connection transistor, and one of the terminals of the said connection transistor is connected to WL3 (i).

A connection transistor is located on a selected cross-point. That is, it may be located at a cross-point which WL3 (i) intersects WL4 (j−2), WLY (j−1), WLY (j), or WL4 (j+1) . . . . Or it may be located at a cross-point which WL4 (i) intersects WL3 (i−1), WL3 (i), or WL3 (i+1) . . . . It is not an alternative, which is different from the case of FIG. 12, as illustrated in FIG. 21.

FIG. 18 is a drawing to illustrate an example of a connection transistor. FIG. 18 (A) corresponds to an example of the connection transistor in FIG. 21. (B) is another example.

(A) illustrates an example of forming a selected cross-point using a connection transistor. That is, the connection at a selected cross-point is formed using one connection gate and two terminals (diffusion layers as an example). (B) illustrates an example of forming a selected cross-point using two connection transistors which are connected in series to each other. That is, since two of the four terminals (diffusion layers as an example) are shared or short-circuits, a selected cross-point can be formed using two connection gates and the two terminals (diffusion layers as an example) remaining.

Use k=0 and k'=1 for the ease of illustration. In (A), WL3 (i) on the M0-th layer is connected to a connection gate of a connection transistor. WL4 (j) on the M1-th layer is connected to one of terminals of the connection transistor. The other terminal remaining is connected to a select gate contact GC of a select gate. By applying a high voltage on WL3 (i) to turn on the connection transistor, the voltage of WL4 (j) is applied to the selected gate contact GC. In (B), WL3 (i) on the M1-th layer is connected to one of the connection gates and WL4 (j) on the M0-th layer is connected to the other of the connection gates. One of the two terminals is connected to a select gate contact GC, and the other is connected to a power supply which is separately connected to the M2-th layer. By applying a high voltage on both WL3 (i) and WL4 (j) to turn on the two connection transistors, the voltage of the power supply that is separately connected to the M2-th layer is applied to the selected gate contact GC.

FIG. 19 illustrates two examples which correspond to FIG. 18 (A). (A1) illustrates a case where the select gate is FIG. 8 (B) (a non-volatile memory cell). (A2) illustrates a case where the select gate is FIG. 8 (C) (a variable resistor memory cell).

Figures 20, 21:
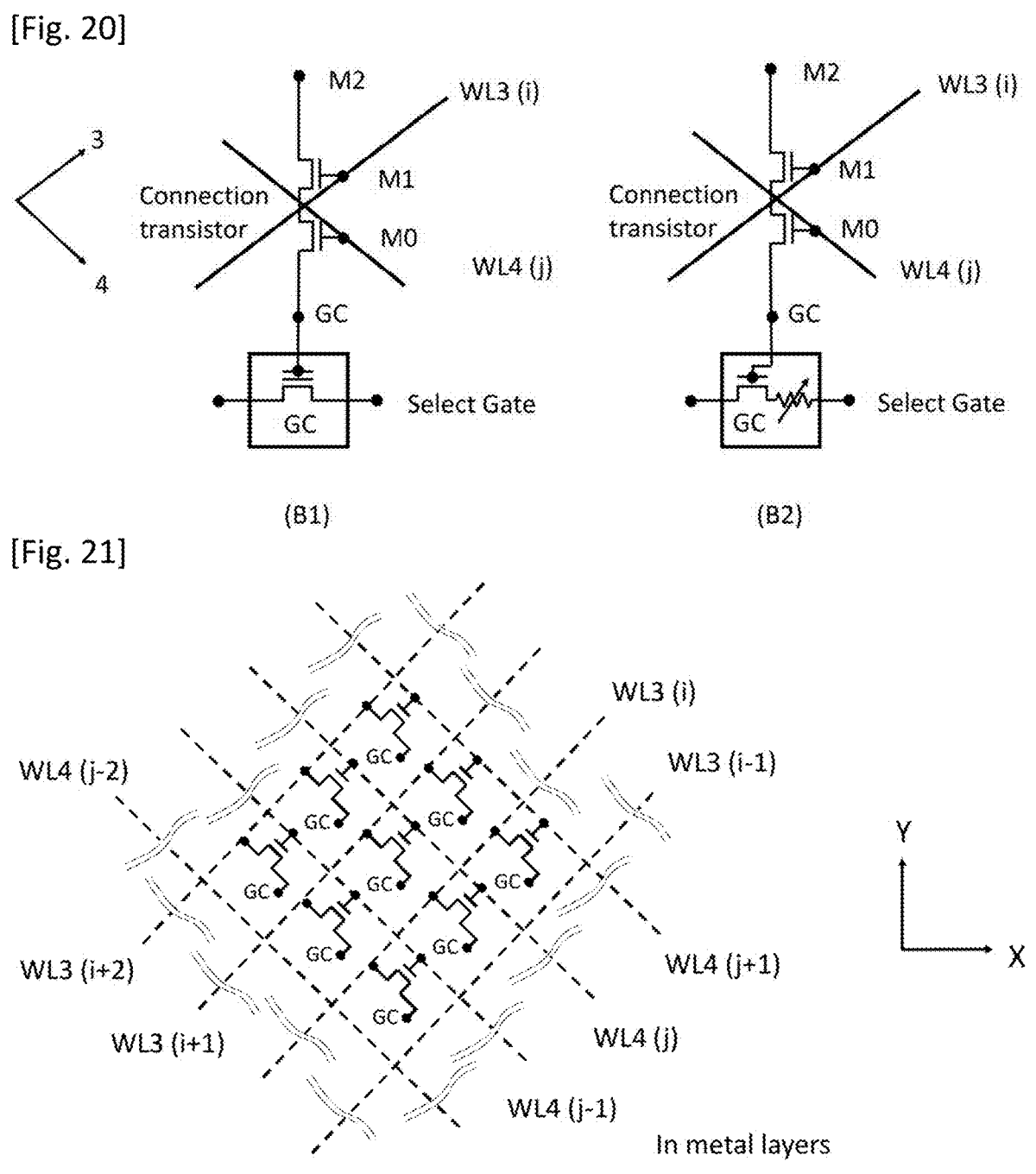

FIG. 20 illustrates two examples which correspond to FIG. 18 (B). (B1) illustrates a case where the select gate is FIG. 8 (B) (a non-volatile memory cell). (B2) illustrates a case where the select gate is FIG. 8 (C) (a variable resistor memory cell).

Non-patent document 1: Goodon E. Moore, "Cramming more components onto integrated circuits", Electronics, volume 38, Number 8, Apr. 19, 1965.

Non-patent document 2: Masanet, E.; Shhehabi, A.; Lei, N.; Smith, S.; Koomey, J. Recalibrating global data center energy-use estimates. Science 2020, vol. 3667, 984-986.

As mentioned above, we have explained the characteristics of the present inventions. Finally, the technical field of the present invention is not limited to the above-mentioned embodiments. In the range that does not deviate from a purpose of this invention, various changes can be made.

INDUSTRIAL APPLICABILITY

The present invention enables for providing the method to carry out the information processing mechanism of the human brain using the silicon technology.

BRIEF DESCRIPTION OF DRAWINGS

FIG. 1 is a drawing to illustrate an example of neurons.

FIG. 2 is a drawing to illustrate an example of synapses.

FIG. 3 is a drawing to illustrate an example of the concept of perceptrons.

FIG. 4 is a drawing to illustrate an example of the method to count the links between two points.

FIG. 5 is a drawing to plot the ratio of information quantity of network and that of bit (bit number) with regard to the node number (N).

FIG. 6 is a drawing to illustrate a possibility in which the signals to the end point are different if paths are different even with the initial and end points being the same.

FIG. 7 is a drawing to illustrate an example of an equivalent circuit diagram to integrate a neural network of the present invention on an IC chip.

FIG. 8 is a drawing to illustrate an example of select gate of the present invention.

FIG. 9 is a drawing to illustrate an example of the method to integrate the networks of the present invention.

FIG. 10 is a drawing to illustrate an example of the method to integrate the networks of the present invention.

FIG. 11 is a drawing to illustrate an example of the wiring layouts of the present invention.

FIG. 12 is a drawing to illustrate an example of the wiring layout of the present invention.

FIG. 13 is a drawing to illustrate an example of the layouts of the connection transistors of the present invention.

FIG. 14 is a drawing to illustrate an example of the connection transistor of the present invention.

FIG. 15 is a drawing to illustrate an example of the connection transistor of the present invention.

FIG. 16 is a drawing to illustrate an example of the connection transistor of the present invention.

FIG. 17 is a drawing to illustrate an example of the wiring layout of the present invention.

FIG. 18 is a drawing to illustrate an example of the methods to wire a select gate of the present invention.

FIG. 19 is a drawing to illustrate an example of the methods to wire a select gate of the present invention.

FIG. 20 is a drawing to illustrate an example of the methods to wire a select gate of the present invention.

FIG. 21 is a drawing to illustrate an example of the layouts of the wiring of the present invention.

The invention claimed is:

1. A semiconductor device, comprising:

a plurality of islands arrayed in a first direction and a second direction on a surface of semiconductor, wherein each island has a diffusion layer formed on the said surface of the semiconductor;

first links arrayed such that each of the first links is between two respective islands of the plurality of islands that are adjacent to each other along the first direction, wherein each of the first links comprises a first select gate bridging two islands of the plurality of islands and having a select gate contact;

second links arrayed such that each of the second links is between two respective islands of the plurality of islands that are adjacent to each other along the second direction, wherein each of the second links comprises a second select gate bridging two islands of the plurality of islands and having a select gate contact;

first word lines, each extending along a third direction that may be the same as or different from the first direction;

second word lines, each extending along a fourth direction that may be the same as or different from the second direction, wherein each select gate contact of the first and second links is selected by at least one of the first word lines and one of the second word lines.

2. The semiconductor device according to claim 1, wherein each of first and second select gates is a transistor having a first terminal in one island of the plurality of islands and a second terminal in another island of the plurality of islands.

3. The semiconductor device according to claim 1, further comprising:

a junction transistor, wherein the said junction transistor has a junction gate and two terminals, the said junction gate is connected to one of the said first word lines, one of the said two terminals is connected to one of the said second word lines, and the other of the said two terminals is connected to a respective one of the select gate contacts.

4. The semiconductor device according to claim 1, further comprising:

two junction transistors which are connected in series with each other, wherein each of the said two junction transistors has a junction gate and two terminals, one of the said two junction gates is connected to one of the said first word lines, the other of the said two junction gates is connected to one of the said second word lines, and one of the two terminals of one of the said two junction transistors is connected to a respective one of the select gate contacts.

5. The semiconductor device according to claim 1, wherein the first word lines are on a first wiring layer, and the second word lines are is on a second wiring layer.

6. The semiconductor device according to claim 1, further comprising:

a bit line and a third select gate, wherein the said third select gate has a select gate contact and two terminals, one of the two terminals of the said third select gate is connected to the said bit line and serves as a bit line contact, the other of the two terminals of the said third select gate is connected to one of the said plural islands, and the said select gate contact of the third select gate is selected by the said first and second word lines.

7. The semiconductor device according to claim 6, further comprising:

an operational amplifier, wherein the said operational amplifier is connected to the said bit line, compares a potential of the said bit line with a predetermined threshold voltage, outputs data 1 if the potential of the said bit line is higher than the said threshold potential or outputs data 0 if the potential of the said bit line is lower than the said threshold potential.

8. The semiconductor device according to claim 7, further comprising:

a first and second bit-line select gates, and a source line, wherein the said first bit line select gate is between the said bit line contact and the said operational amplifier, and the said second bit line select gate is between the said bit line contact and the said source line.

9. The semiconductor device according to claim 8, further comprising:

a capacitor, wherein the said capacitor is between the said first and second bit-line select gates and is connected to the said bit line.

* * * * *